(12) United States Patent
McQuade et al.

(10) Patent No.: US 6,906,540 B2
(45) Date of Patent: Jun. 14, 2005

(54) METHOD FOR CHEMICALLY ETCHING PHOTO-DEFINED MICRO ELECTRICAL CONTACTS

(75) Inventors: Francis T. McQuade, Watertown, CT (US); Charles L. Barto, Oakville, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 107 days.

(21) Appl. No.: 10/027,146

(22) Filed: Dec. 20, 2001

(65) Prior Publication Data

US 2003/0057957 A1 Mar. 27, 2003

Related U.S. Application Data (60) Provisional application No. 60/323,651, filed on Sep. 20, 2001.

(51) Int. Cl.$^7$ ............................................... G01R 31/02
(52) U.S. Cl. ........................................................ 324/754
(58) Field of Search ............................... 324/754–755, 324/757, 761–762; 29/825, 842, 846, 874, 889; 438/118, 127, 66

(56) References Cited

U.S. PATENT DOCUMENTS

| | | | |
|---|---|---|---|
| 3,960,560 A | 6/1976 | Sato | 96/36 |
| 3,966,473 A | 6/1976 | Sato | 96/36 |
| 4,027,935 A | 6/1977 | Byrnes et al. | 339/48 |
| 4,451,327 A | 5/1984 | Nelson | 156/646 |
| 4,466,859 A | 8/1984 | Nelson | 156/646 |
| 4,520,314 A | 5/1985 | Asch et al. | 324/158 P |
| 4,747,907 A | 5/1988 | Acocella et al. | 156/642 |
| 4,980,638 A | 12/1990 | Dermon et al. | 324/158 P |
| 5,326,428 A * | 7/1994 | Farnworth et al. | 324/754 |
| 5,416,429 A | 5/1995 | McQuade et al. | 324/762 |
| 5,495,667 A | 3/1996 | Farnworth et al. | 29/843 |
| 5,508,144 A | 4/1996 | Katz et al. | 430/296 |
| 5,864,946 A | 2/1999 | Eldridge et al. | 29/843 |
| 5,917,707 A | 6/1999 | Khandros et al. | 361/776 |
| 5,952,843 A | 9/1999 | Vinh | 324/761 |
| 5,959,461 A | 9/1999 | Brown et al. | 324/765 |
| 6,023,103 A | 2/2000 | Chang et al. | 257/781 |
| 6,031,383 A | 2/2000 | Streib et al. | 324/754 |
| 6,043,563 A | 3/2000 | Eldridge et al. | 257/784 |
| 6,124,723 A | 9/2000 | Costello | 324/762 |

(Continued)

FOREIGN PATENT DOCUMENTS

| | | | |
|---|---|---|---|
| EP | 1120657 A1 | 8/2001 | |
| JP | 03062546 A * | 3/1991 | ........... H01L/21/66 |
| JP | 6249878 | 9/1994 | |
| JP | 2001208772 | 8/2001 | |
| WO | WO 01/67116 A2 | 9/2001 | |

OTHER PUBLICATIONS

Wentworth Laboratories, Inc., Cobra: Vertical Technology Probe Card (2002) (Jun. 7, 2002) at http://www.wentworth-labs.com/product/cobra.htm.

*Translation of Official Japanese Office Action,* Mailing No. 228197, Mailed on Jun. 25, 2004 for Japanese Patent Application No. 2002–273131.

*Primary Examiner*—Vinh Nguyen
*Assistant Examiner*—Jermele Hollington
(74) *Attorney, Agent, or Firm*—Wiggin and Dana LLP; Anthony P. Gangemi; Gregory S. Rosenblatt (57) ABSTRACT

A method of fabricating a plurality of micro probes comprising the steps of defining the shapes of a plurality of probes as a mask, applying a photoresist to a surface of a metal foil, overlaying the mask on the metal foil, exposing the photoresist to light passed through the mask, developing the photoresist, removing a portion of the photoresist to expose a portion of the metal foil, applying an etcher to the surface of the metal foil to remove the exposed portion to produce a plurality of probes, and chemically polishing and plating the plurality of probes.

13 Claims, 7 Drawing Sheets

U.S. PATENT DOCUMENTS

| | | | | |
|---|---|---|---|---|
| 6,144,212 A | * | 11/2000 | Mizuta | 324/754 |
| 6,150,186 A | | 11/2000 | Chen et al. | 438/14 |
| 6,160,412 A | | 12/2000 | Martel et al. | 324/761 |
| 6,163,162 A | | 12/2000 | Thiessen et al. | 324/761 |
| 6,194,127 B1 | | 2/2001 | Stolk et al. | 430/313 |
| 6,215,321 B1 | * | 4/2001 | Nakata | 324/754 |
| 6,255,602 B1 | | 7/2001 | Evans et al. | 174/262 |
| 6,297,657 B1 | | 10/2001 | Thiessen et al. | 324/761 |
| 6,303,262 B1 | | 10/2001 | Takaoka et al. | 430/231 |
| 6,330,744 B1 | * | 12/2001 | Doherty et al. | 29/846 |
| 6,334,856 B1 | * | 1/2002 | Allen et al. | 604/191 |
| 6,363,605 B1 | * | 4/2002 | Shih et al. | 29/600 |
| 6,448,506 B1 | * | 9/2002 | Glenn et al. | 257/686 |
| 6,564,454 B1 | * | 5/2003 | Glenn et al. | 29/852 |
| 6,573,734 B2 | * | 6/2003 | He et al. | 324/696 |

\* cited by examiner

METHOD FOR CHEMICALLY ETCHING PHOTO-DEFINED MICRO ELECTRICAL CONTACTS

CROSS-REFERENCE TO RELATED APPLICATIONS

This patent relates to and claims priority to U.S. Provisional Patent Application No. 60/323,651, filed on Sep. 20, 2001. That Provisional Patent Application is incorporated by reference in its entirety herein.

BACKGROUND OF THE INVENTION

(1) Field of the Invention

This invention relates to a method for the manufacture of miniature micro probes or electrical contacts for use in testing semiconductor chips. More particularly, this invention relates to a method of photo-defining a plurality of probes on metallic flat stock coated with a chemical resist emulsion and then removing unwanted metal to produce a plurality of micro probes.

(2) Description of the Related Art

Figure 1:
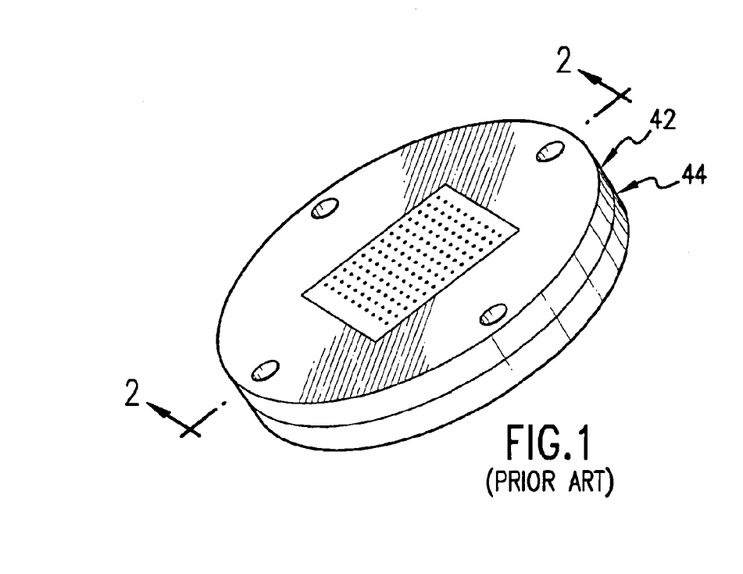
FIG. 1 is a perspective illustration of a probe test head known in the art.
Figure 2:
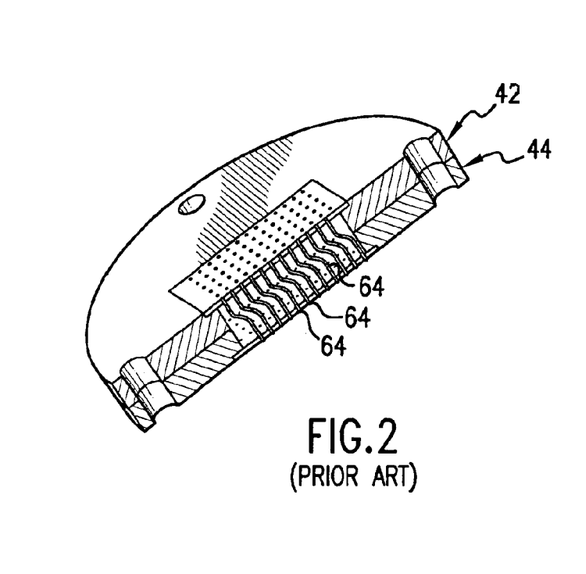
FIG. 2 is a perspective illustration of a cross section of a probe test head known in the art.
Figure 3:
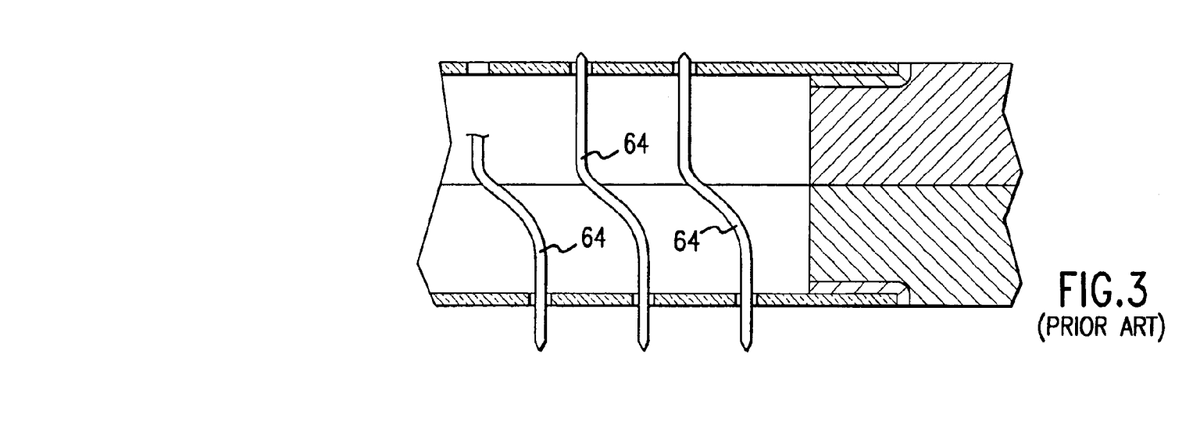
FIG. 3 is a cross section of a portion of a probe test head known in the art.
Figure 13:
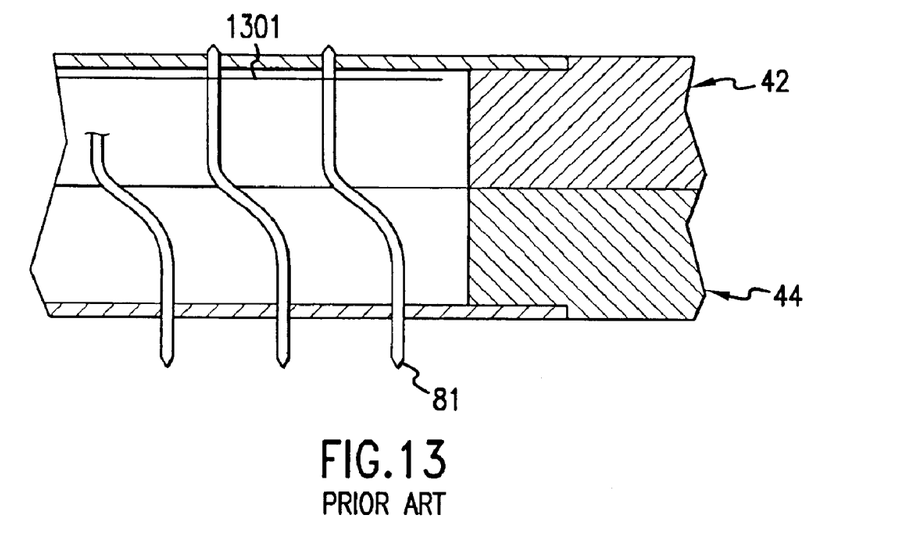
FIG. 13 is a cross section of a portion of a probe test head of the present invention.

It is known in the art of testing probe cards for electrical continuity to perform such tests using probes made by mechanically forming a straight piece of fine wire into a desired shape so as to provide the necessary size and spring force. FIGS. 1–3 show a conventional "Cobra™" probe test head produced by Wentworth Laboratories, Inc. of Brookfield, Conn. Such probe heads consist of an array of probes 64 held between opposing first (upper) 42 and second (lower) 44 dies. Each probe has opposing upper and lower ends. The upper and lower dies 42, 44 contain patterns of holes corresponding to spacing on an integrated circuit contact pad spacing designated herein as lower die hole pattern and upper die hole pattern. The upper end of each of the probes is retained by the upper die hole pattern, and the lower end of each of the probes passes through the lower die hole pattern and extends beyond the lower die 44 to terminate in a probe tip. With reference to FIG. 13, there is illustrated the additional inclusion of mounting film 1301. Mounting film 1301 is typically formed from a suitable polymeric dielectric such as mylar and holds the etched probes 81 in place. For Cobra™ style probes, the lower die hole pattern is offset from that in the upper die 42, and the offset is formed into the probe such that the probe acts like a spring. Returning to FIGS. 1–3, when the test head is brought into contact with a wafer to be tested, the upper end of the probe remains predominately stationary, while the lower end compresses into the body of the test head. This compliance allows for variations in probe length, head planarity, and wafer topography. The probe is typically formed by swaging or stamping a straight wire to produce the desired probe shape and thickness. This swaging process flattens and widens the center, curved portion of the probe in order to achieve a desired force per mil of probe deflection.

The lower and upper ends of the swaged area also prevent the probe from extending too far through the dies. In a conventional probe manufacturing process, the probes are formed from a straight piece of wire, typically of beryllium-copper alloy. Custom tooling is used for each probe size and design. The tooling stamps and forms the center portion of the wire to achieve the desired shape and thickness, thereby generating a desired spring rate.

Figure 9:
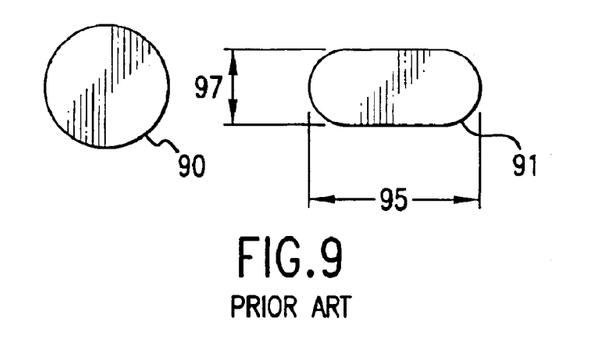
FIG. 9 is a cross sectional illustration of a probe known in the art both before and after machining.

With reference to FIG. 9 there is illustrated cross sectional renderings of a wire used in the prior art to produce probes. Cross section 90 illustrates the generally circular form of the pre-stamped wire. Cross section 91 illustrates the generally elliptical shape of a stamped and tooled wire. The cross sectional areas of both cross section 90 and cross section 91 are substantially the same. With reference to cross section 91, the stamped wire forming the probe has a width 95 of approximately 7 mil (one mil equals 0.001 inch) and a height 97 of approximately 1.8 mils. When assembled in a probe head configuration it is preferable to maintain at least a 1 mil separation between the plurality of probes used in the probe head. As a result of width 95 being approximately 7 mils and requiring a 1 mil separation, conventional probes arranged in a probe head are typically spaced one probe every 8 mils. The wire is then cut to length, and the desired probe tip geometry is ground on the end of the probe. The tolerance on the overall length of the finished probes is +/−0.002". Because this is too large a variance between probes for proper testing, the probes are assembled into a probe head and the entire array of probes is lapped to achieve a more uniform probe length.

Figure 5:
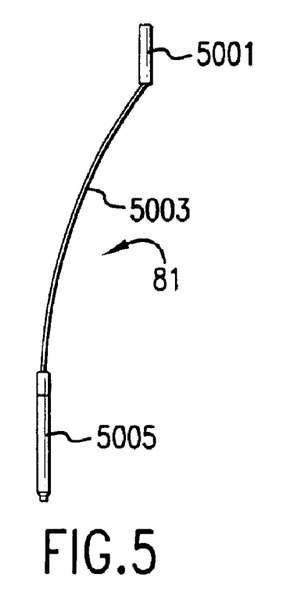
FIG. 5 is a side view of a probe of the present invention.
Figure 8:
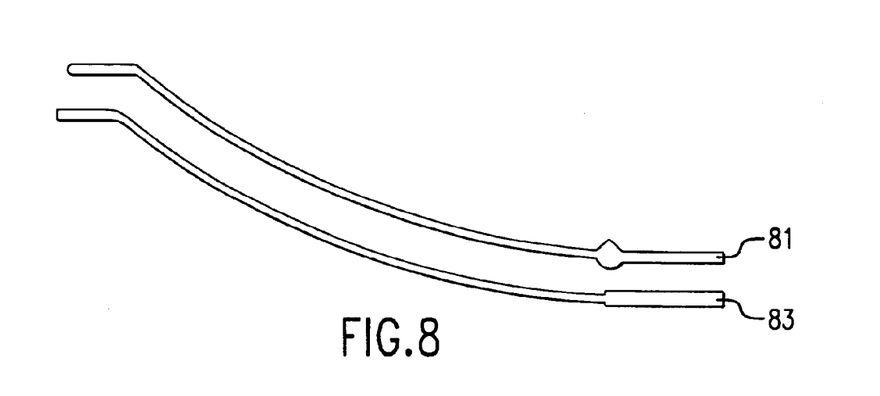
FIG. 8 is a photograph of a standard probe known in the art and an etched probe of the present invention.

With reference to FIG. 8, there is illustrated a standard probe 83 known to the art and the etched probe 81 of the present invention. With reference to FIG. 5, there is illustrated the basic components of probes. Probe base 5001 is a relatively short and straight expanse connected to probe shaft 5003. Probe shaft 5003 is a gently curving expanse of the probe 81,83 that terminates in the probe end 5005. In operation, it is probe end 5005 that comes in contact with the circuit to be tested.

Conventional stamping processes used to form probes often result in residual stresses in the probes which may cause reduced fatigue life. Because these residual stresses can change over time, changes in probe stiffness may arise. In addition, changes in the requirements for probes require retooling. Such retooling contributes to a high cost for probes manufactured in such a fashion and require a substantial lead time before such probes are available. It is also the case that mechanically fashioned probes are more difficult to redesign as their construction is closely tied to the mechanical means by which they are created.

There therefore exists a need for a method of manufacturing such probes that avoids the problems which arise from mechanical formation. There is further a need for such a method substantially amenable to producing probes of different designs absent a protracted retooling process.

BRIEF SUMMARY OF THE INVENTION

One aspect of the instant invention is drawn to a method of fabricating a plurality of micro probes comprising the steps of defining the shapes of a plurality of probes as one or more masks, applying a photoresist to first and second opposing sides of a metal foil, overlaying one each of the masks on opposing first and second sides of the metal foil, exposing the photoresist to light passed through each of the masks, developing the photoresist, removing a portion of the photoresist to expose a portion of the metal foil, and applying an etcher to the surface of the metal foil to remove the exposed portion to produce a plurality of probes.

Another aspect of the invention is drawn to a micro probe manufactured according to the aforementioned method wherein the micro probe comprises a probe base having a generally uniform thickness bounded by a plurality of edges and extending for a substantially straight length in a plane, a probe shaft connected to the probe base the probe shaft of the generally uniform thickness, bounded by a plurality of edges, and extending along a curved expanse within the plane, a probe end connected to the probe shaft the probe end of the generally uniform thickness, bounded by a plurality of edges, and extending for a substantially straight distance within the plane the straight distance being approximately parallel to the straight length, and a scallop running substantially around a periphery comprised of the edges of the probe base, the probe shaft, and the probe end.

Yet another aspect of the invention is drawn to a probe test head comprising a first die comprised of first and second opposing planar surfaces the first die further comprising a pattern of first die holes extending through the first die in a direction perpendicular to both of the first and second planar surfaces, a second die comprised of third and forth opposing planar surfaces the second die further comprising a pattern of second die holes corresponding to the pattern of first die holes the second die holes extending through the second die in the direction wherein the third planar surface is arranged in planar contact with the second planar surface such that the second die holes are offset from the first die holes in a substantially uniform direction, and a plurality of probes one each of the probes extending through one of the first die holes and one of the second die holes the probes having a surface finish commensurate with having been formed by etching.

DETAILED DESCRIPTION

Figure 7:
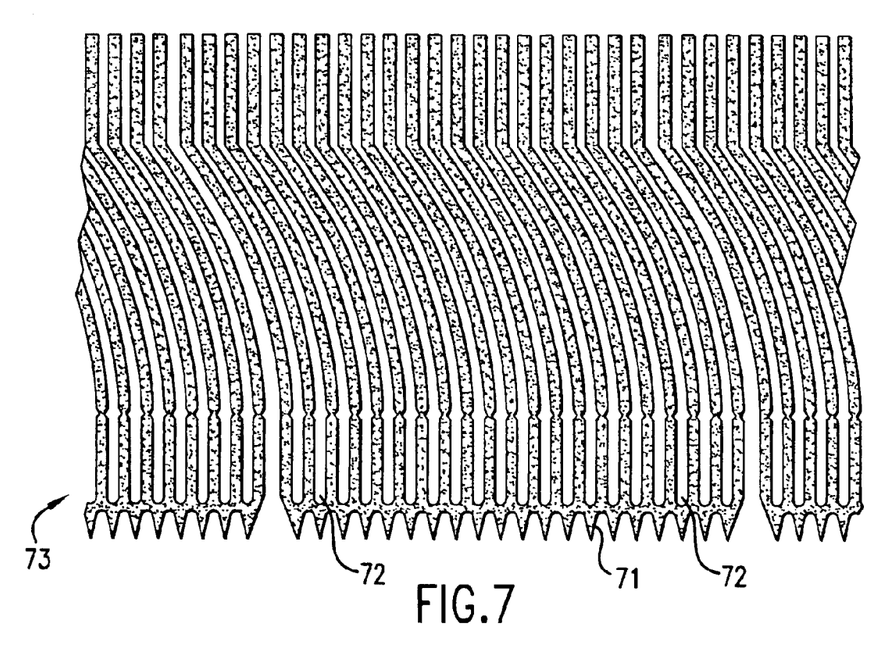
FIG. 7 is a photograph of a mask of the present invention.

The present invention is drawn to a method of manufacturing probes in a way that provides improved uniformity while lowering the manufacturing cost of the probes. The probes are manufactured through a photo-etching process rather than a mechanical stamping process prevalent in the art. In this process of the present invention, the probes are etched from thin metal flat stock, typically of Beryllium-Copper alloy. With reference to FIG. 8, there is illustrated an etched probe 81 of the present invention. The desired shape of the probe is specified as an image in graphic form, and the image is used to make a glass mask having a repeating pattern of the desired probe profile. FIG. 7 illustrates a sample of such a mask 73. Mask 73 is comprised of a plurality of probe shapes 72 and dark spaces 71. The probe shapes 72 define the areas corresponding to the etched probes of the present invention and are constructed so as to allow light to pass substantially unimpeded through probe shapes 72. Dark spaces 71 extend predominantly between probe shapes 72 and serve to substantially differentiate one probe shape 72 from each other probe shape 72 on mask 73.

Figure 12:
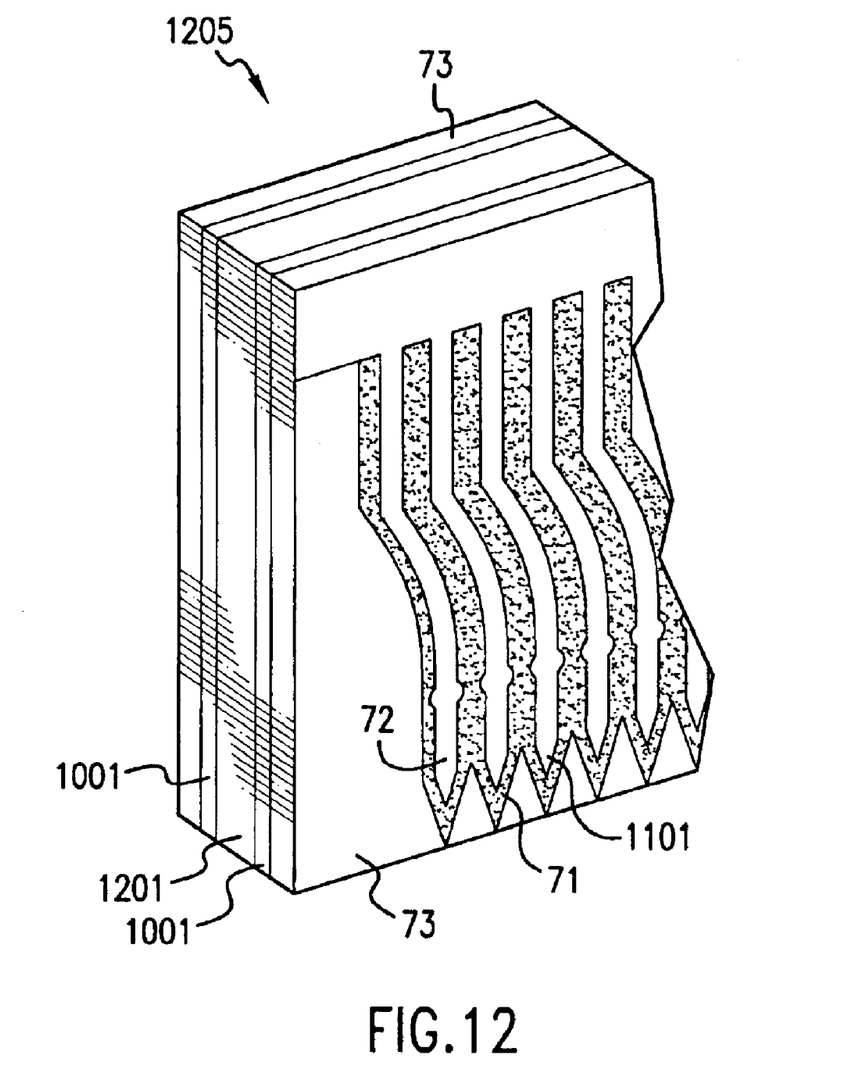
FIG. 12 is a perspective illustration of the configuration of the masks, the photoresist, and the flat stock of the present invention prior to etching.

With reference to FIG. 12, there is illustrated the probe configuration 1205 employed to produce the etched probes of the present invention. Flat stock 1201 is a predominantly planar sheet of thin metal having opposing planar surfaces. Flat stock 1201 has a width corresponding to the desired width of the finished probe. A preferred width of the flat stock 1201 is approximately 3 mil.

A photoresist 1001 is then applied to both opposing planar surfaces of flat stock 1201. Two identical masks 73 are then fastened to opposing sides of flat stock 1201 with one side of each mask 73 in contact with the photoresist 1001 covering a single side of flat stock 1201. The two masks 73 are aligned such that any one feature in either mask 73 corresponding to an identical feature in the other mask 73 is in exact alignment across an axis perpendicular to the expanse of the planar surfaces of flat stock 1201. Light is then applied to each mask 73 effective to expose the photoresist 1001 disposed between each mask 73 and flat stock 1201. Both masks 73 are then separated from probe configuration 1205. After exposure of the photoresist 1001 to light, the photoresist 1001 is developed and rinsed. As a result of rinsing, exposed photoresist 1001 corresponding to a probe shape 72 on mask 73 remains bonded to flat stock 1201, while unexposed portions of photoresist 1001 corresponding to a dark space 71 is rinsed off of and out of contact with flat stock 1201.

An etcher is then applied at substantially the same time to both surfaces of flat stock 1201. The etcher begins to dissolve flat stock 1201 in a direction extending from the outer surfaces of flat stock 1201 along an axis perpendicular to the planar expanse of flat stock 1201 and directed into flat stock 1201 from each opposing planar surface. One attribute of applying etcher to a photoresist affixed to a metal substrate in order to dissolve the metal substrate is the presence of under cutting. As used herein, "undercutting" refers to the tendency of an etcher applied to dissolve metal to deviate from an etched path extending perpendicular to the surface to which the etcher was applied. Specifically, the etcher tends to extend outward as it travels into the metal.

Figure 10:
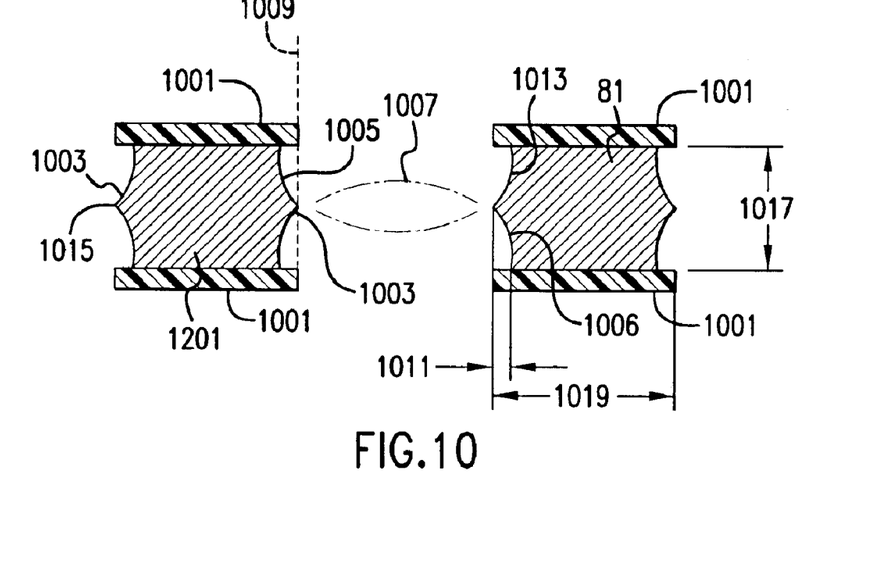
FIG. 10 is a cross sectional diagram of a probe of the present invention after etching.

With reference to FIG. 10, there is illustrated the effect on undercutting on the etched probes of the present invention. FIG. 10 is a cross sectional view of the etched probes of the present invention after applying the etcher. As can be seen, the etcher has effectively removed the metal comprising flat stock 1201 from the area bordered by undercut 1005 and etch limit 1007. As is illustrated, undercut 1005 extends from an exterior surface of flat stock 1201 towards the interior of flat stock 1201. Note that undercut 1005 deviates slightly from perpendicular axis 1009 running perpendicular to the surfaces of flat stock 1201. Etch limit 1007 is the boundary designating the extent to which the etcher removes flat stock 1201 up until the etcher is neutralized or otherwise rendered incapable of further etching. Because the etcher etches at a substantially constant rate and follows a path along undercut 1005 deviating from perpendicular axis 1009, the resultant etch limit 1007 forms a gently curving boundary. By controlling the amount of time that the etcher is exposed to flat stock 1201, it is possible to produce the cross sectional geometry of each probe as illustrated in FIG. 10.

Figure 11:
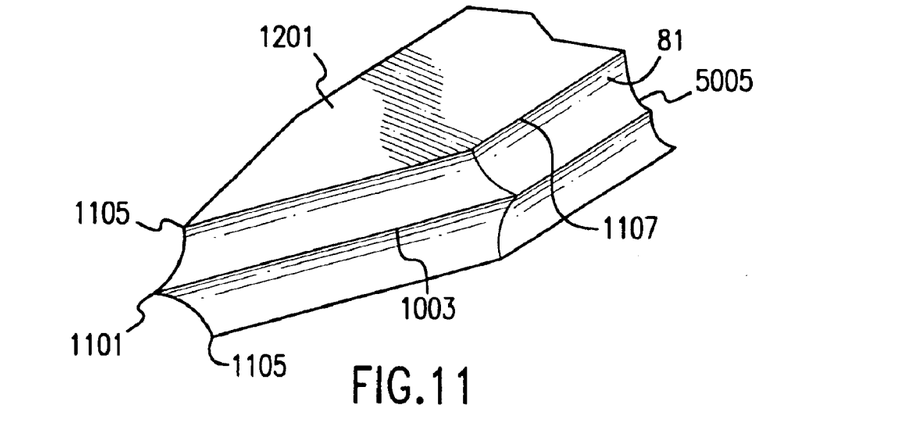
FIG. 11 is a perspective illustration of the tip of a probe of the present invention.

The resultant superposition of two opposing etch limits 1007 results in the presence of sharp protrusions or scallops 1003 extending around the perimeter of each etched probe. Note that the distance from scallop base 1013 to scallop tip 1015 forms the scallop dimension 1011. With reference to FIG. 11, there is illustrated a perspective view of a probe end 5005. As can be seen, scallop 1003 extends around the edge 1107 of the etched probe 81 including probe tip 1101. Outer probe tip 1105 is located on opposing sides the flat stock 1201 comprising etched probe 81 at the furthest extreme of probe end 5005. Probe tip 1101 can be seen to extend beyond outer probe tip 1105 as a result of the scallop 1003 extending around the terminus of probe end 5005. The resulting extension of probe tip 1101 beyond outer probe tip 1105 allows for better contact with electrical circuits when etched probe 81 is in use.

Removing the unexposed metal results in an array of probes attached at their top end. The array of probes is then chemically polished and plated. The probes are then removed from the flat stock 1201 and readied for assembly into a probe head. The tops of the probes forming the assembly are lapped while the tips are held referenced to a flat surface to bring the probes to the same length.

Figure 4:
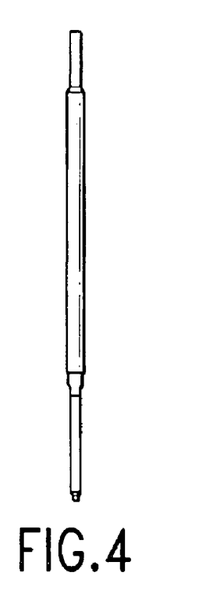
FIG. 4 is a front view of a probe of the present invention.
Figure 6:
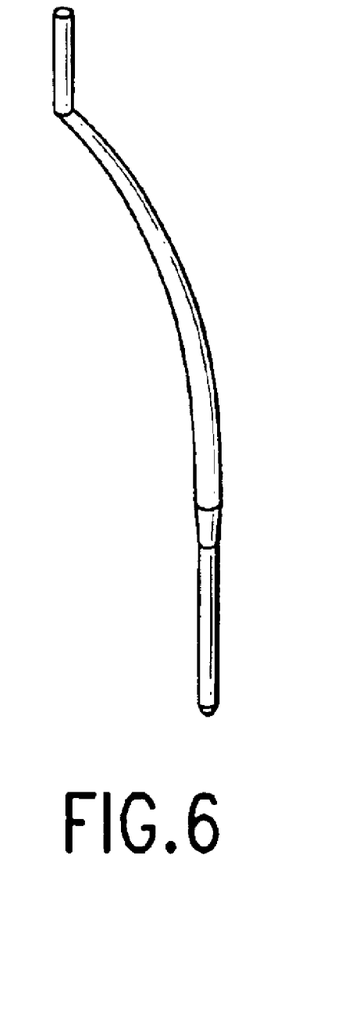
FIG. 6 is an isometric view of a probe of the present invention.

With reference to FIGS. 4–6, there is illustrated the shape of a probe of the present invention. With reference to FIG. 8, as has been described, the etched probes 81 of the present invention are manufactured to a desired configuration absent mechanical stamping or other processes which typically result in residual stresses present in the probes 81. As used herein, "residual stresses" refers to stresses that remain as the result of plastic deformation. Conventional probes tend to contain residual stresses resulting from the mechanical stamping and machining employed to create a desired probe cross-section. These residual stresses serve to limit the functionality of conventional probes in at least two primary ways. First, residual stresses cause conventional probes to exhibit non-uniform resistive forces in response to a series of constant deflections administered to the probe over a period of time. As a result, conventional probes used regularly over a period of time tend to suffer from degradations in their ability to supply constant resistive forces to uniform deflections administered over a period of time. Second, conventional probes comprised of residual stresses are more likely to break in response to a deflection. In contrast, the etched probes 81 of the present invention are created from an etching process which does not require mechanical stamping or machining to achieve desired cross sectional characteristics. As a result, the etched probes 81 do not contain any residual stresses induced as a result of machining or stamping.

As used herein, "yield strength" refers to the property of a probe to deflect, or yield, in a predominantly linear direction when a force is applied while retaining the ability to return to its original, non-deflected state absent the application of a force. The greater the yield strength of a probe, the greater the linear deflection that may be exerted upon the probe prior to the probe reaching its yield point, whereupon the probe will not return to its original shape. Applicants anticipate that the etched probes of the present invention exhibits increased yield strength compared to probes formed from mechanical processing. Specifically, Applicants anticipate that the etched probes may be deflected a linear distance approximately 20% greater than that distance through which a conventional probe may be deflected before reaching the yield point.

In addition, it is anticipated that the etched probes of the present invention will possess improved spring force uniformity over probes formed in the conventional manner. As used herein, "spring force" refers to the opposing resistive force generated in a probe which is deflected through a distance. Specifically, it is anticipated that the maximum difference in the spring forces amongst all of the etched probes in a probe test head will be approximately 20% less than the maximum difference in the spring forces amongst all of the conventional probes in a similar probe test head apparatus.

With reference to FIG. 10, etched probe 81 has a depth 1017 and a width 1019. Depth 1017 is typically approximately 3 mils while width 1019 is typically approximately 1 mil. Because the etched probes 81 are considerably narrower than conventional probes 83, when assembled in a probe head the etched probes 81 may be assembled spaced approximately every 4 mils while conventional probes 83 are typically spaced approximately every 8 mils. Because the center-center distance between the etched probes of the present invention assembled in a probe head can be as small as 4 mils, as opposed to the approximately 8 mils required of conventional probes, the etched probes may be used for testing smaller integrated circuits wherein the distance between contacts on the integrated circuit wafer is as small as approximately 4 mils.

In addition, because a plurality of etched probes 81 is fashioned from a single flat stock 1201, each etched probe 81 is substantially similar in its physical characteristics to each and every other etched probe 81 fashioned from the same flat stock 1201.

EXAMPLE 1

The following example details parameters preferable to practicing the present invention. Preferably, there is practiced a plurality of steps including material preparation, photo masking, etching, chemical polishing, plating, and a process of individualizing the probes thus formed. As used herein, "DI" is a descriptor meaning de-ionized. In addition, as used herein, "UX DI" refers to ultrasonically agitated de-ionized water.

To prepare the material out of which the probes were to be formed, BeCu 17200 Flat stock was cut into squares with side lengths approximating four inches. The flat stock was then cleaned with Citra-solv (by Citra-Solv, LLC of Danbury, Conn.)/DI H2O 20 ML/1 L (UX 15 Min.). The surface of the flat stock was then air blown dry and the resulting package was then heat hardened in a vacuum for approximately two hours at 600° F.

Next, the prepared material was photo masked. To accompish the photo masking, the material was again cleaned with Clean Citra-Solv/DI H2O 20ML/1 L (UX 15 Min.). Next the material was provided a dip coat with a withdraw rate of 13.3 Sec./1 in. (Shipley SP2029-1) Thinned to 35 Zon/Sec. at 21° C. The material was then dried for approximately 30 minutes at 90° C. and allowed to cool at room temperature under conditions of greater than fifty percent relative humidity. Next, the prepared surface of the material was exposed to approximately 100 milijules 365 nanometer wavelength UV light. The surface exposed to the light was then developed for approximately 1 min 30 sec (Shipley 303 developer, by Shipley Inc. of Newton Mass., at 85° F.). Lastly, the prepared surface was rinsed in cascading DI water for 15 minutes then air blown dry and stored.

Next, etching was performed using a Marseco Mod.# CES-24, by Marseco Inc. of Huntington Beach, Calif. Hi-speed circuit etching was then performed using Phibro- Tech High Speed Circuit etching solution with the following parameter settings:

Temperature setting 128 deg. F. (act 127 deg. F.)
Pump speed (Pump #1–45%) (Pump #2–73%)
Conveyor (11%)
Oscillation (Normal)

A foil test piece was then mounted to the carrier and run through the etcher. The critical dimensions of the resultant parts created from the foil test piece were then measured and adjustments made if necessary. After adjustments were made, the remaining foils were run through the etcher at 30 sec. intervals.

Next a chemical polish/bright dip was applied to the probes formed from etching. The probes were submerged in PNA Etch in a 2 L beaker at 145–150° F. while stirring. The solution was comprised as follows:

| | |
|---|---|
| Phosphoric Acid | 760 ML of a 98% solution |
| Nitric Acid | 40 ML of a 69–70% solution |
| Acetic Acid | 1200 ML of a 60% solution |

First, the etch rate was established using a test piece of material. Next, the probe material was etched to remove 0.0001" Next the material was rinsed in hot DI, in UX DI for approximately 15 minutes and a DI cascade for approximately 2 minutes. Lastly, the probes are oven dried at 100° C. until dry.

Next, the probes were plated using a Pallamerse Immersion Palladium 5% solution, by Technic Inc. of Cranston R.I., and a Pd activator 25% solution manufactured by Technic Inc. and a Vertrel solvent by Dupont Fluoroproducts of Wilmington, Del. The probes were then weighed and their weights recorded. The probes were then washed in the Vertrel solvent for approximately two minutes. Next, the probes were rinsed in DI $H_2O$ for one minute and in a 10% sulfuric acid solution for two minutes followed by another two minute rinse in DI $H_2O$. The probes were then immersed for 30 seconds in the Technic Pd activator and once again rinsed in DI $H_2O$ for 30 seconds. The probes were then immersed for 45 minutes in Technic immersion Palladium while stirring slowly, rinsed with running DI $H_2O$ and dried. The probes were then re-weighed and their weights recorded.

Lastly, the probes were individualized. A sample of the probes, preferably five or six probes, is tested to measure the grams of resistive force generated within each of the probes when deflected from one to eight millimeters in one millimeter increments. The results on one such test group of probes is illustrated in Table 1. The results of the test were used to assess the uniformity of the probes created from any one initial flat stock as well as conformity to desired properties. The probes were then put in a vile and labeled with tip and shank dimension.

There is therefore provided herein a process for mass producing miniature micro probes or electrical contacts for use in the testing of semiconductor chips having the following advantages over the conventional probe manufacturing process. First the method of the present invention provides improved uniformity and dimensional accuracy between the probes. The glass mask determines the geometry of the probes, eliminating mechanical variances between the probes. As a result, the stiffness of the probes are more uniform, allowing for a balanced contact force across the array.

In addition, there are no stresses induced in the probes during fabrication, resulting in improved probe strength and endurance. The conventional stamping process results in residual stresses, causing reduced fatigue life. The stresses can change over time, causing changes in probe stiffness.

The present invention provides for lower cost and lead-time in manufacturing. Many probes are manufactured simultaneously, and the tip geometry can be made via the etching process rather than as a follow-on process step. The polishing and plating processes are also done simultaneously.

The probe design of the present invention can be easily modified. The spring rate can be controlled by varying the artwork used to create the glass mask, and by the thickness of the flat metal stock selected. New designs can be made by simply creating a new mask. There is no need for expensive and time consuming re-tooling.

Lastly, the etched probes produced by the method for the present invention do not require a swage to achieve the required stiffness. As a result, the probes can be placed closer together, allowing for a denser array.

We claim:

1. A method of fabricating a plurality of micro probes comprising the steps of:

providing one or more masks, each of said one or more masks including a plurality of probe shapes, each of said plurality of probe shapes including a probe base, a probe shaft connected to said probe base, a probe end connected to said probe shaft, and one or more raised surfaces on at least one of said probe base, said probe end, and said probe shaft;

applying a photoresist to first and second opposing sides of a metal foil;

overlaying one each of said masks on opposing first and second sides of said metal foil;

exposing said photoresist to light passed through each of said masks;

developing said photoresist;

removing a portion of said photoresist to expose a portion of said metal foil; and applying an etcher to the surface of said metal foil to remove said exposed portion to produce a plurality of

TABLE 1

| Sample | Dim. 1st Touch | Force 1st Touch | 1 mil | 2 mil | 3 mil | 4 mil | 5 mil | 6 mil | 7 mil | 8 mil |
|---|---|---|---|---|---|---|---|---|---|---|
| 1 | 0 | .0050 | 4.80 | 9.80 | 12.95 | 15.63 | 17.86 | 20.10 | 21.41 | 21.72 |
| 2 | 0 | .0053 | 4.50 | 8.80 | 12.23 | 15.21 | 17.80 | 19.81 | 21.60 | 18.02 |
| 3 | 0 | .0051 | 4.80 | 9.90 | 13.60 | 17.00 | 19.70 | 21.30 | 22.31 | 23.31 |
| 4 | 0 | .0056 | 4.91 | 9.60 | 13.92 | 17.70 | 20.30 | 22.80 | 24.80 | 25.41 |
| 5 | 0 | .0045 | 5.80 | 11.00 | 14.90 | 17.30 | 19.60 | 21.72 | 22.22 | 22.50 |
| 6 | 0 | .0053 | 4.82 | 8.66 | 12.23 | 14.92 | 17.30 | 19.50 | 21.26 | 22.15 | probes, each of said plurality of probes including a probe base, a probe shaft connected to said probe base, a probe end connected to said probe shaft, and one or more raised surfaces on at least one of said probe base, said probe end, and said probe shaft.

2. The method of claim 1 comprising the additional stop of chemically polishing and plating the plurality of probes after the application of the etcher to the surface of said metal foil.

3. A micro probe comprising:

a probe base having a generally uniform thickness bounded by a plurality of edges and extending for a substantially straight length in a plane;

a probe shaft connected to said probe base said probe shaft of said generally uniform thickness, bounded by a plurality of edges, and extending along a curved expanse within said plane;

a probe end connected to said probe shaft said probe end of said generally uniform thickness, bounded by a plurality of edges, and extending for a substantially straight distance within said plane said straight distance being approximately parallel to said straight length;

one or more raised surfaces positioned on at least one of said probe base, said probe shaft, and said probe end, wherein said one or more raised surfaces are not formed from a mechanical process; and a scallop running substantially around a periphery comprised of the edges of said probe base, said probe shaft, and said probe end.

4. The micro probe of claim 3 wherein said uniform thickness is preferably between 2 mils and 5 mils.

5. The micro probe of claim 4 wherein said uniform thickness is most preferably between 3 mils and 4 mils.

6. The micro probe of claim 5 wherein said scallop further comprises a scallop base and a scallop tip.

7. The micro probe of claim 6 wherein said scallop base and said scallop tip are separated by a substantially uniformly distance.

8. A probe test head comprising:

a first die comprised of first and second opposing planar surfaces said first die further comprising a pattern of first die holes extending through said first die in a direction perpendicular to both of said first and second planar surfaces;

a second die comprised of third and forth opposing planar surfaces said second die further comprising a pattern of second die holes corresponding to said pattern of first die holes said second die holes extending through said second die in said direction wherein said third planar surface is arranged in planar contact with said second planar surface such that said second die holes are offset from said first die holes in a substantially uniform direction; and a plurality of probes one each of said probes extending through one of said first die holes and one of said second die holes, wherein each of said plurality of probes includes means for removably retaining said plurality of probes within said first and second die and said means for removably retaining said plurality of probes are not formed from a mechanical process.

9. The probe test head of claim 8 wherein each of said plurality of probes is substantially uniform in shape when compared to each other one of said plurality of probes.

10. The probe test head of claim 8 wherein the length of each of said plurality of probes is preferably within 0.002 inches of every other one of said plurality of probes.

11. The probe test head of claim 10 wherein the length of each of said plurality of probes is preferably within 0.001 inches of every other one of said plurality of probes.

12. The probe test head of claim 11 wherein the length of each of said plurality of probes is preferably within 0.0005 inches of every other one of said plurality of probes.

13. The probe test head of claim 8, wherein said means for removably retaining said plurality of probes within said first and second die includes one or more raised surfaces positioned on each of said plurality of probes.

\* \* \* \* \*